United States Patent
Li et al.

(10) Patent No.: US 8,526,252 B2
(45) Date of Patent: Sep. 3, 2013

(54) QUIESCENT TESTING OF NON-VOLATILE MEMORY ARRAY

(75) Inventors: Hai Li, Eden Prairie, MN (US); Yiran Chen, Eden Prairie, MN (US); Alan Xuguang Wang, Eden Prairie, MN (US); Haiwen Xi, Prior Lake, MN (US); Wenzhong Zhu, Apple Valley, MN (US); Andreas K. Roelofs, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 35 days.

(21) Appl. No.: 12/405,932

(22) Filed: Mar. 17, 2009

(65) Prior Publication Data

US 2010/0238700 A1  Sep. 23, 2010

(51) Int. Cl.
*G11C 29/00* (2006.01)

(52) U.S. Cl.
USPC .......................................... 365/200; 365/201

(58) Field of Classification Search
USPC .................. 365/148, 158, 200, 201, 163, 226
See application file for complete search history.

(56) References Cited

U.S. PATENT DOCUMENTS

| | | | | |
|---|---|---|---|---|
| 5,491,665 A | * | 2/1996 | Sachdev | 365/189.04 |
| 5,577,050 A | * | 11/1996 | Bair et al. | 714/710 |
| 5,670,892 A | * | 9/1997 | Sporck | 324/762.01 |
| 5,757,816 A | * | 5/1998 | Al-Assadi et al. | 714/718 |
| 5,789,933 A | | 8/1998 | Brown et al. | |
| 5,889,409 A | * | 3/1999 | Kalb, Jr. | 324/750.3 |
| 6,205,559 B1 | * | 3/2001 | Sakaguchi | 714/25 |
| 6,301,168 B1 | * | 10/2001 | Crocker | 365/201 |
| 6,356,498 B1 | * | 3/2002 | Keeth | 365/226 |
| 6,366,108 B2 | * | 4/2002 | O'Neill et al. | 324/762.02 |
| 6,975,978 B1 | * | 12/2005 | Ishida et al. | 703/15 |
| 6,977,855 B2 | * | 12/2005 | Callaway et al. | 365/201 |
| 7,062,689 B2 | | 6/2006 | Slobodnik | |
| 7,208,759 B2 | | 4/2007 | Momohara | |
| 7,254,764 B2 | * | 8/2007 | Ishida et al. | 714/738 |
| 7,272,767 B2 | * | 9/2007 | Colunga et al. | 714/745 |
| 7,282,905 B2 | | 10/2007 | Chen et al. | |
| 7,424,660 B2 | | 9/2008 | Kebichi et al. | |
| 7,984,353 B2 | * | 7/2011 | Furukawa et al. | 714/738 |
| 2004/0025123 A1 | * | 2/2004 | Angilivelil | 716/4 |
| 2009/0103350 A1 | * | 4/2009 | Kund | 365/148 |

* cited by examiner

*Primary Examiner* — Kretelia Graham
(74) *Attorney, Agent, or Firm* — Hall Estill Attorneys at Law

(57) ABSTRACT

A method and apparatus for testing an array of non-volatile memory cells, such as a spin-torque transfer random access memory (STRAM). In some embodiments, an array of memory cells having a plurality of unit cells with a resistive sense element and a switching device has a row decoder and a column decoder connected to the plurality of unit cells. A test circuitry sends a non-operational test pattern through the array via the row and column decoders with a quiescent supply current to identify defects in the array of memory cells.

17 Claims, 5 Drawing Sheets

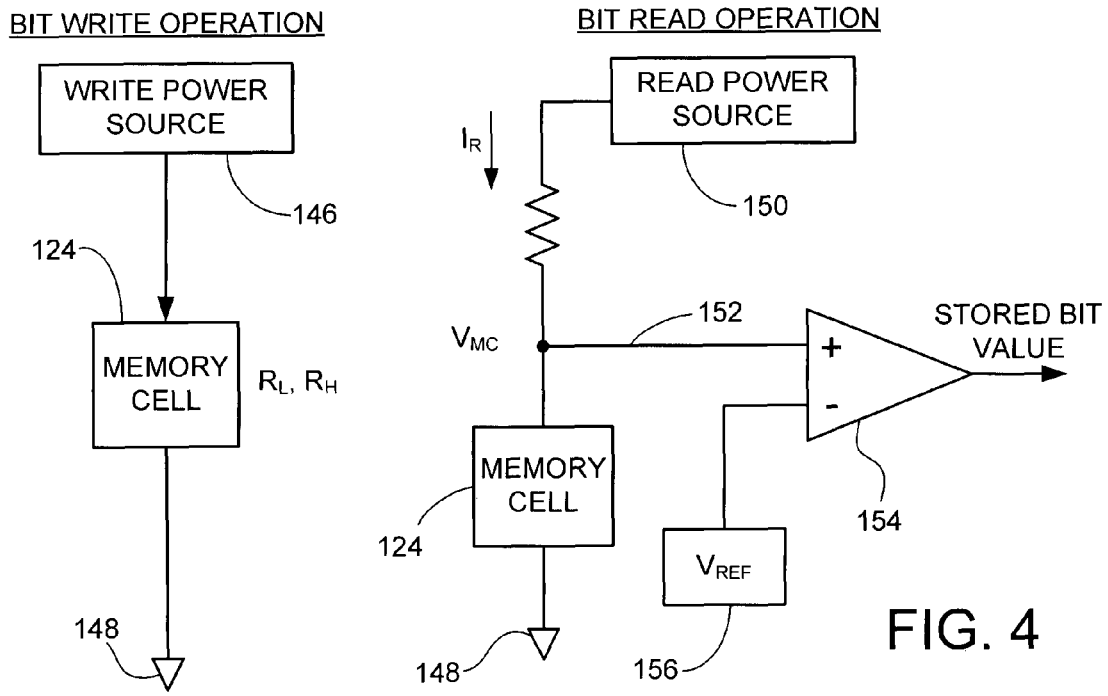
FIG. 3
FIG. 4
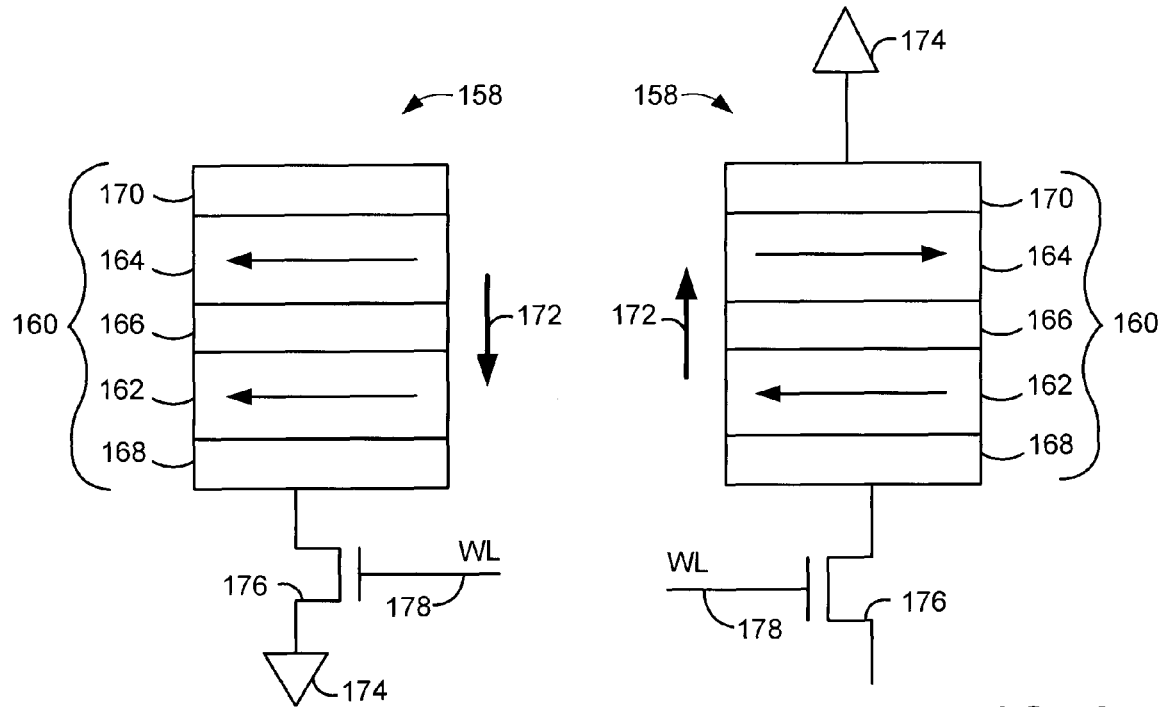
FIG. 5
FIG. 6

QUIESCENT TESTING OF NON-VOLATILE MEMORY ARRAY

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell operation, particularly by improving the accuracy and efficiency of testing an array of memory cells

SUMMARY

Various embodiments of the present invention are directed to a method and apparatus for testing an array of non-volatile memory cells, such as but not limited to a STRAM memory cell.

In accordance with various embodiments, an array of memory cells having a plurality of unit cells with a resistive sense element and a switching device has a row decoder and a column decoder connected to the plurality of unit cells. A test circuitry sends a non-operational test pattern through the array via the row and column decoders with a quiescent supply current to identify defects in the array of memory cells.

In other embodiments, an array of memory cells having a plurality of unit cells with a resistive sense element and a switching device that are connected to row and column decoders is provided. The array is tested with a test circuitry capable of sending a non-operational test pattern through the array via the row and column decoders and the test pattern is sent with a quiescent supply current to identify defects in the array of memory cells.

These and various other features and advantages which characterize the various embodiments of the present invention can be understood in view of the following detailed discussion and the accompanying drawings.

BRIEF DESCRIPTION OF THE DRAWINGS

FIG. 3 displays a manner in which data can be written to a memory cell of the memory array.

FIG. 4 illustrates a manner in which data can be read from the memory cell of FIG. 3.

FIG. 5 shows a non-volatile memory cell operated in accordance with various embodiments of the present invention.

FIG. 6 displays a non-volatile memory cell operated in accordance with various embodiments of the present invention.

DETAILED DESCRIPTION

Figure 1:
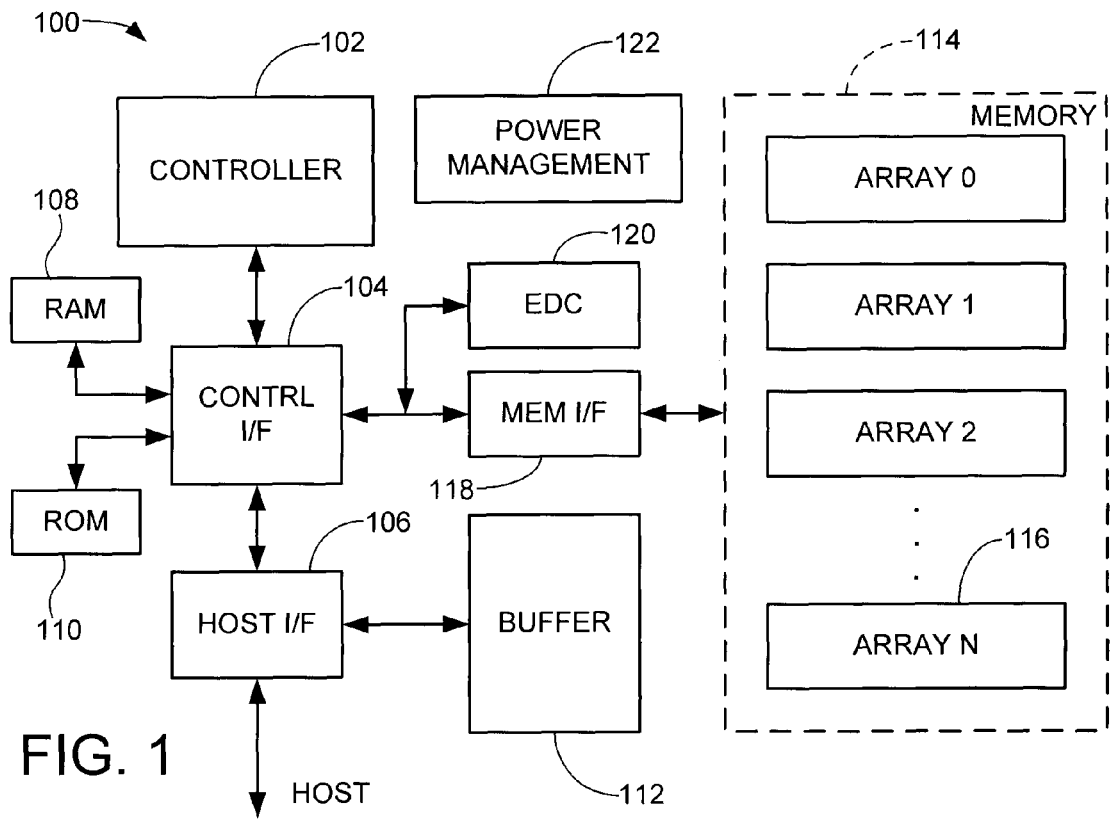
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
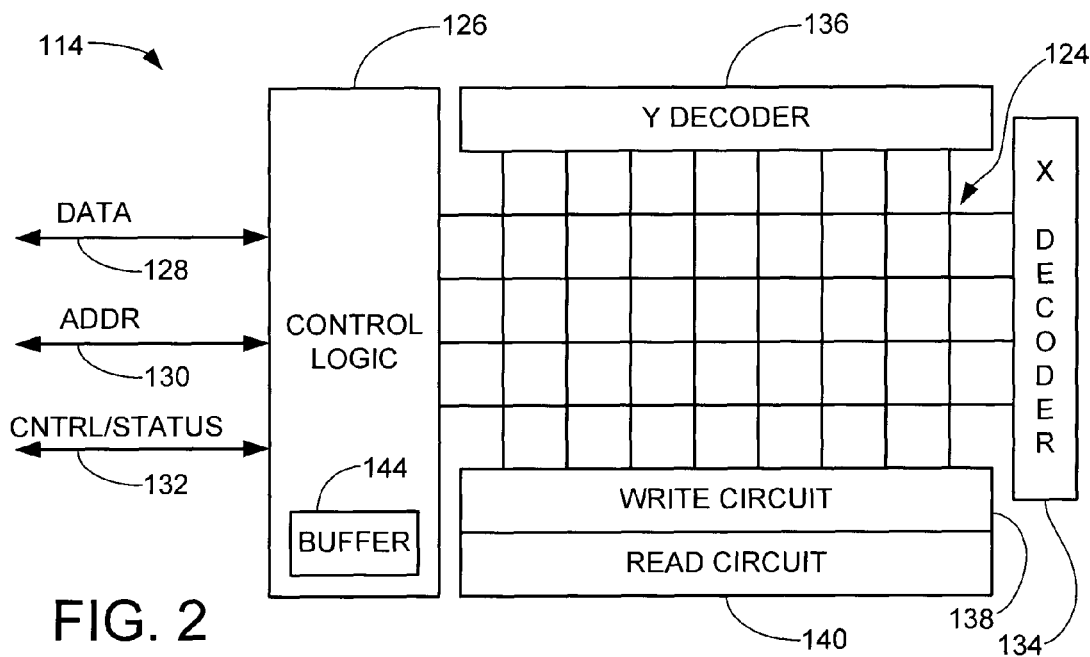
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines, etc.

In some embodiments, each of the array memory cells 124 has magnetic random access memory (MRAM) configuration, such as a spin-torque transfer random access memory (STTRAM or STRAM) configuration.

The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100 K$\Omega$ or so Other resistive memory type configurations (e.g., RRAMS) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 shows a resistive sense element 158 with a magnetic tunneling junction (MTJ) 160. The resistive sense element 158 is substantially similar to the memory cell 124 of FIGS. 3 and 4. The MTJ 160 has a fixed magnetic layer 162 and a free magnetic layer 164 adjacent an antiferromagnetic layer 166. A first electrode 168 and second electrode 170 are positioned adjacent to the fixed layer 162 and free layer 164, respectively. In some embodiments, the first and second electrodes 168 and 170 comprise spin polarizing material that uniformly orients the spin of current passing through the memory cell 124. Either the first or second electrode 168 or 170 are connected to a ground 174 through a switching device 176 that is selectable through a word line 178. The selection of the switching device 176 allows a voltage differential from one electrode to the opposing electrode to drive current through the memory cell 124.

As a write current 172 flows through the MTJ 160, the magnetization of the fixed layer 162 is carried through the antiferromagnetic layer 166 to set the free layer 164 with a magnetization direction and a resistance state. The relationship of the magnetizations of the free layer 164 and the fixed layer 162 correspond to either a high resistance state or a low resistance state. That is, if the free layer 164 and fixed layer 162 have the same magnetic direction, a low resistance state will be present in the MTJ 160. In contrast, opposing magnetic directions between the fixed layer 162 and the free layer 164 indicate a high resistance state.

In FIG. 6, the memory cell 124 of FIGS. 3 and 4 is displayed. The memory cell 124 comprises a MTJ 160 that has a fixed magnetic layer 162 and a free magnetic layer 164 disposed about an antiferromagnetic layer 166 as well as a top and bottom electrode 168 and 170 that are positioned adjacent to the free and fixed layers 162 and 164. The connection of the top electrode 170 to a ground 174 allows a write current 172 to pass through the memory cell 124 at a direction that opposes the direction illustrated in FIG. 5. The passage of a write current 172 through the memory cell 124 results in the programming of the free layer 164 with a magnetic direction that dictates either a high resistance state or a low resistance state based on the magnetic relationship with the fixed layer 162.

The fixed layer 162 and free layer 164 can be constructed with multiple layers and materials that perform different functions. For example, the free layer 164 can comprise a spin polarizing layer with a predetermined magnetization to uniformly spin the electrons of the incoming write current 172. Further in some embodiments, the fixed layer 162 can comprise a material different that a hard magnet that provides fixed magnetization and a spin polarizing component that affects the incoming write current 172.

Figure 7:
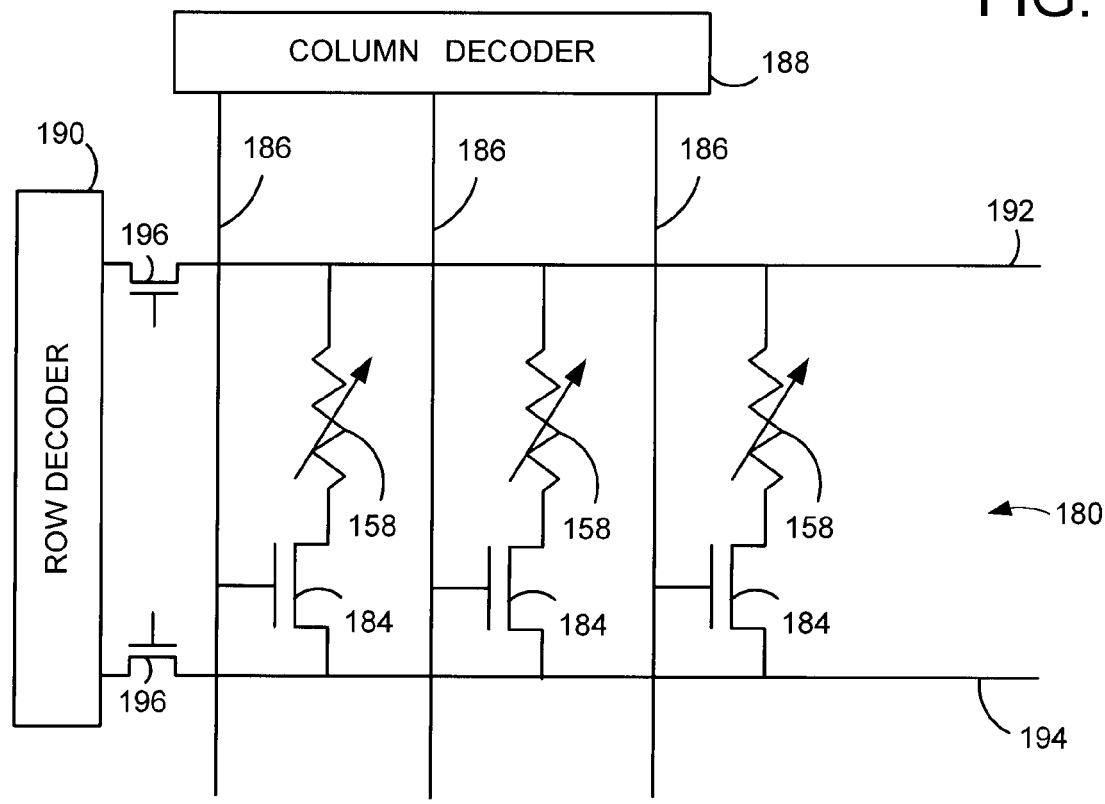
FIG. 7 provides an array of memory cells operated in accordance with various embodiments of the present invention.

FIG. 7 shows a memory array 180 operated in accordance with various embodiments of the present invention. It can be appreciated by a skilled artisan that the memory array 180 can be implemented in various devices, such as the memory devices shown in FIG. 1. A plurality of resistive sense elements 158 are each connected to a switching device 184 that is selectable through a word line 186. A column decoder 188 is connected to a plurality of the word lines 186 and is capable of configuring the memory array 180 to send a test pattern through a selected number of resistive sense elements 158. A row decoder 190 is connected to a bit line 192 and a source line 194 and can configure the memory array 180 to send a test pattern through predetermined resistive sense elements 158. Further, a line switching device 196 is connected to the bit line 192 and source line 194 to allow for the manipulation of signals through the bit line 192 and resistive sense elements 158.

Each resistive sense element 158 and corresponding switching device 184 forms a unit cell that allows a resistance state and a corresponding logical state to be written to the resistive sense element 158. The writing of a logic state with a write current 172 creates a voltage differential between the bit line 192 and the source line 194.

It should be noted that the configurability of the memory array 180 enables various testing patterns to be employed to identify defects. In various embodiments of the present invention, the row and column decoders 188 and 190 comprise a built-in self test (BIST) that controls the testing of the memory array efficiently with a quiescent supply current. A quiescent supply current requires a static condition in the memory array 180 for accurate testing due to the evaluation of the output current to pass through current from a circuit without faults. Thus, the manipulation of the memory array 180 for testing creates a non-operational environment to which only a quiescent supply current is applied.

In some embodiments, the BIST test circuit of the row and column decoders 188 and 190 comprises a pseudo-random pattern generator (PRPG) and a multiple input signature register (MISR) that implement testing signals received from a controller, such as 102 of FIG. 1. Likewise, a test access port (TAP) can be utilized between the BIST and the controller to distribute signals to the PRPG and MISR. The BIST can be configured so that the PRPG produces pseudo-random vectors from a seed value while the MISR captures test data from the memory array 180. To efficiently output test data from the memory array 180, the MISR compresses the collected test data into a "signature" that is processed and read by the controller.

Furthermore, the various requirements of the testing patterns and static condition of the unit cells do not allow access to the memory array 180 that can be considered operational. In fact, the memory array 180 is often manipulated with predetermined signals to set the logical state of selected resistive sense elements 158 before the decoders 188 and 190 form connections that statically test array 180 for defects with a quiescent supply current.

Figure 8:
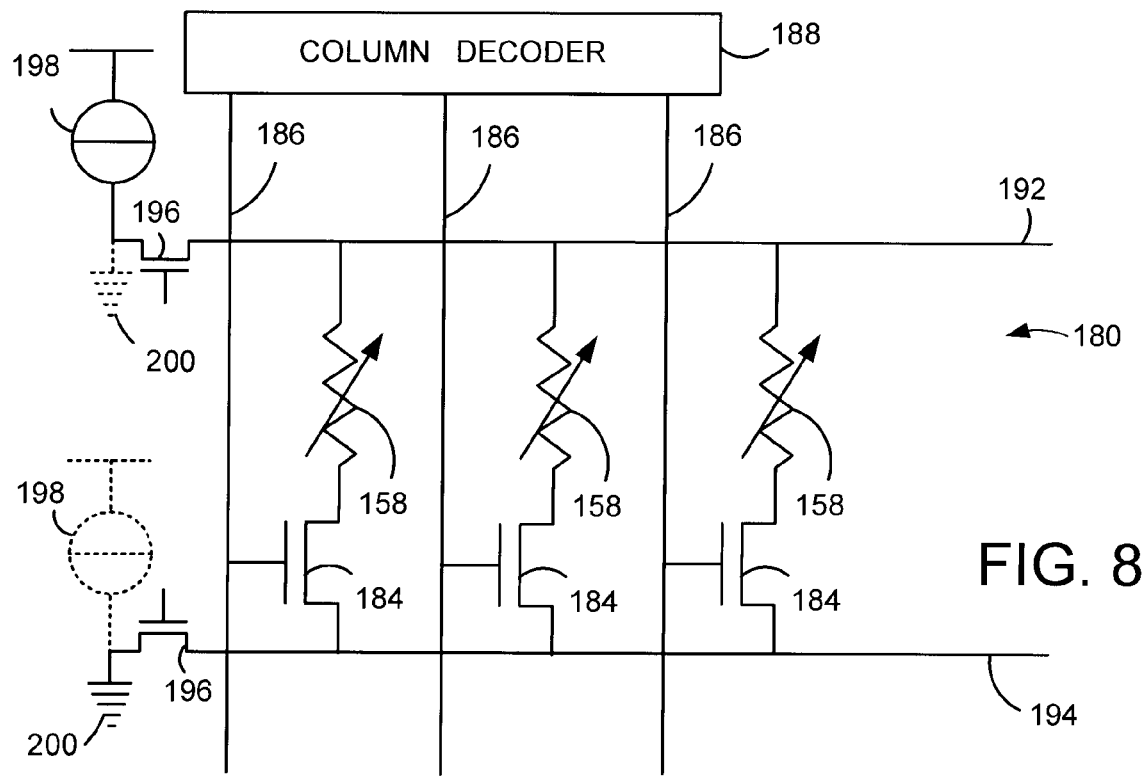
FIG. 8 shows an array of memory cells operated in accordance with various embodiments of the present invention.

The memory array 180 of FIG. 7 is displayed in FIG. 8 in accordance with various embodiments of the present invention. The row decoder 190 and column decoder 188 are shown manipulating the various current pathways of the memory array 180 to allow various components to be tested individually or in combination. Among the various configurations of the memory array 180 and row decoder 190 is the connection of a source 198 and ground 200 to either the bit line 192 or source line 194 to create a current pathway through the unit cells selected by the word lines 186. In some embodiments, a test pattern comprises a signal sent from a source 198 and flows through selected resistive sense elements 158 and switching devices 184 in route to a ground 200 located on the opposing parallel line (either bit line 192 or source line 194).

It can be appreciated by one skilled in the art that numerous memory array 180 configurations are possible with manipulation of the row decoder 190 alone. However, the row decoder 190 and column decoder 188 can operate in unison or in sequence to further configure the memory array 180 into pathways that allow testing of precise electrical connections.

Figure 9:
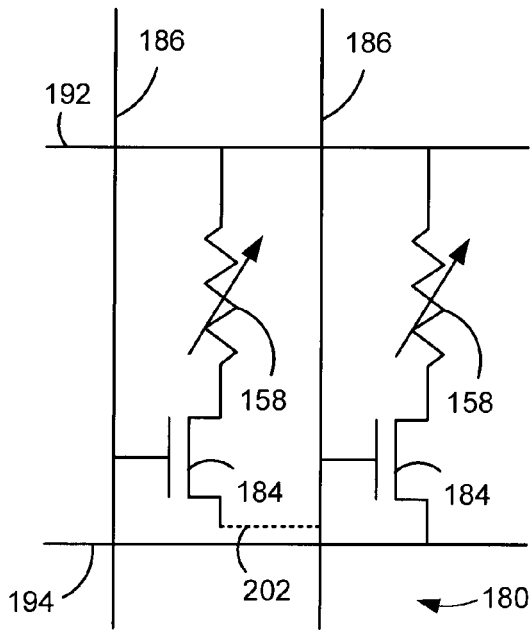
FIG. 9 illustrates a defect in an array of memory cells.

An exemplary defect to be detected in a memory array 180 in accordance with various embodiments of the present invention is provided in FIG. 9. A stuck-at-fault (SAF) 202 defect is a connection between the switching device 184 and an unspecified node. For example, the output drain of the switching device 184 is connected to the word line 186 corresponding to a separate unit cell. The connection between the switching device 184 and the word line 186 creates a defect that will register as an elevated output voltage once a test pattern is sent through the memory array 180.

Figure 10:
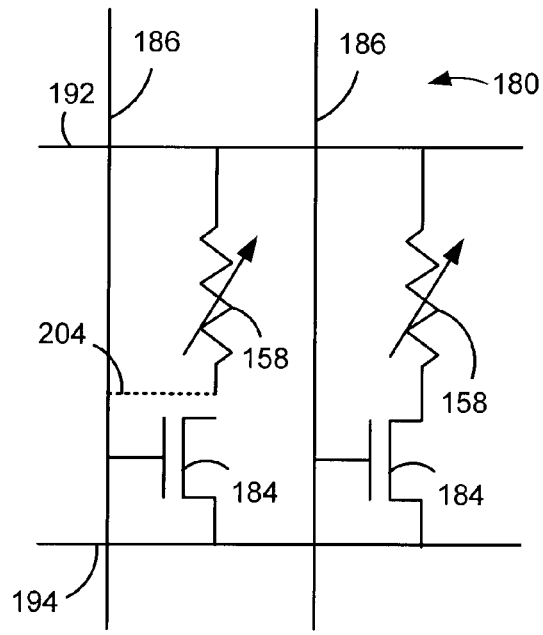
FIG. 10 displays a defect in an array of memory cells.

In FIG. 10, an exemplary defect to be detected in a memory array 180 in accordance with various embodiments of the present invention is shown. A stuck open fault (SOF) 204 exists when a connection between the switching device 184 and its corresponding word line 186 becomes fixed. Thus, a permanent connection exists from the resistive sense element 158 and the word line 186 that ensures the unit cell is always selected and receiving test signals. The constantly selected status of a resistive sense element 158 prevents the proper configurability and operation of the memory array 180.

Figure 11:
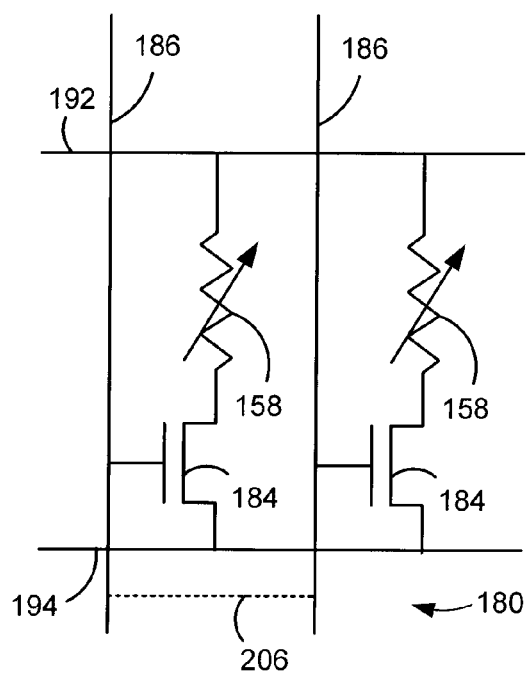
FIG. 11 provides a defect in an array of memory cells.

FIG. 11 displays an exemplary defect to be detected in a memory array 180 in accordance with various embodiments of the present invention. A coupling fault 206 is present when a connection is made between two different word lines 186. Likewise, the bridging of two different bit lines 192 provides a coupling fault 206 that is detrimental to the operation of the array 180. The row and column decoders 188 and 190 are configurable to test for coupling faults by forming a variety of connections in the array 180.

The effectiveness of a testing pattern can be determined by the changing in leakage current in a memory array 180 with respect to leakage in a non-faulty array. The sensitivity of a testing pattern can be computed by the equation:

$$\text{Sensitivity} = \frac{Iddq(\text{faulty}) - Iddq(nonfaulty)}{Iddq(nonfaulty)} \quad [1]$$

where Iddq(faulty) corresponds to the current value for a faulty array and Iddq(nonfaulty) is the current value for a nonfaulty array. However, the entire memory array 180 is not always tested. In fact, some embodiments of the present invention configure the memory array 180 to test precise connections of components in the array. Table 1 provides the sensitivity of precise configurations for testing bridging defects, such as those illustrated in FIGS. 9, 10, and 11. The table is merely an exemplary representation of various testing patterns and is not a comprehensive depiction of the process.

TABLE 1

Testing Patterns and Sensitivity for Bridging Defects

| Bridge | Testing Pattern | Sensitivity |
|---|---|---|
| BL-VDD | All WL = '0', All BL = '0' | 526% |
| BL-VSS | All WL = '0', All BL = '1' | 526% |
| SL-VDD | All WL = '0', All SL = '0' | 526% |
| SL-VSS | All WL = '0', All SL = '1' | 526% |
| WL-VDD | All WL = '0' | 526% |
| WL-VSS | All WL = '1', All BL = '0', All SL = '0' | 526% |
| BL-SL | Scan WL in Write Operations ('0' or '1') | 12% |
| BL-WL | Scan WL in Write '1' Operations | 24% |
| WL-SL | Scan WL in Write '1' Operations | 24% |
| BL1-BL2 | Scan in Write '0' Operation | −6% |
| SL1-SL2 | Scan in Write '1' Operation | −6% |
| BL1-SL2 | Scan in Write '0' or '1' Operation | −6% |

Figure 12:
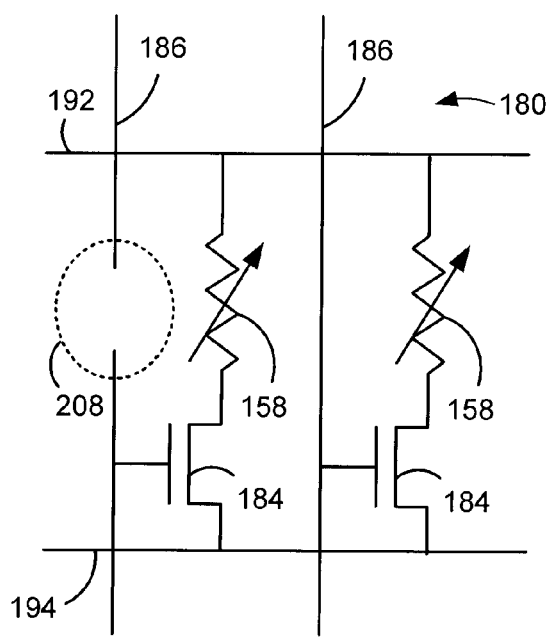
FIG. 12 illustrates a defect in an array of memory cells.

FIG. 12 displays an exemplary defect to be detected in a memory array 180 in accordance with various embodiments of the present invention. The presence of an incomplete connection is an open fault 208 that prevents any electrical signal from passing through the connection. The existence of such an open fault 208 vastly increases the resistance of a selected pathway through the array 180 and results in an increased output current when tested by the row and column decoders 188 and 190. Table 2 illustrates the sensitivity of precise configuration for testing open defects, such as those shown in FIG. 12. Again, the table is merely an exemplary representation of various testing patterns and is not a comprehensive depiction of the process.

TABLE 2

Testing Patterns and Sensitivity for Open Defects

| Open Location | Testing Pattern | Sensitivity |
| --- | --- | --- |
| BL Open | Scan WL in Write Operations ('0' or '1') | 12% |
| SL Open | Scan WL in Write Operations ('0' or '1') | 12% |
| WL Open | Scan WL in Write Operations ('0' or '1') | 12% |
| Switching Device Drain Open | Scan WL in Write Operations ('0' or '1') | 12% |
| Switching Device Source Open | Scan WL in Write Operations ('0' or '1') | 12% |

Further in various embodiments of the present invention, the resistive sense elements 158 can be tested with the testing patterns shown in Table 3. The row and column decoders 188 and 190 can be configured to conduct the testing pattern required to accurately identify the location and nature of any defect present in the memory array 180. Yet again, the table is merely an exemplary representation of various testing patterns and is not a comprehensive depiction of the process. It can be appreciated that any type of defect can be testing using a variety of the testing patterns individually, or in combination.

TABLE 3

Testing Patterns and Sensitivity for Resistive Sense Element Defects

| Stuck-at Failures | Testing Pattern | Sensitivity |
| --- | --- | --- |
| Stuck at '1' | Write all cells to '0', Read BL Vread, scan WL | 4% |
| Stuck at '0' | Write all cells to '1', Read BL Vread, scan WL | 6% |
| MTJ Open | Scan WL in Write Operations ('0' or '1') | 12% |
| MTJ Short | Scan WL in Write Operations ('0' or '1') | 24% |

Figure 13:
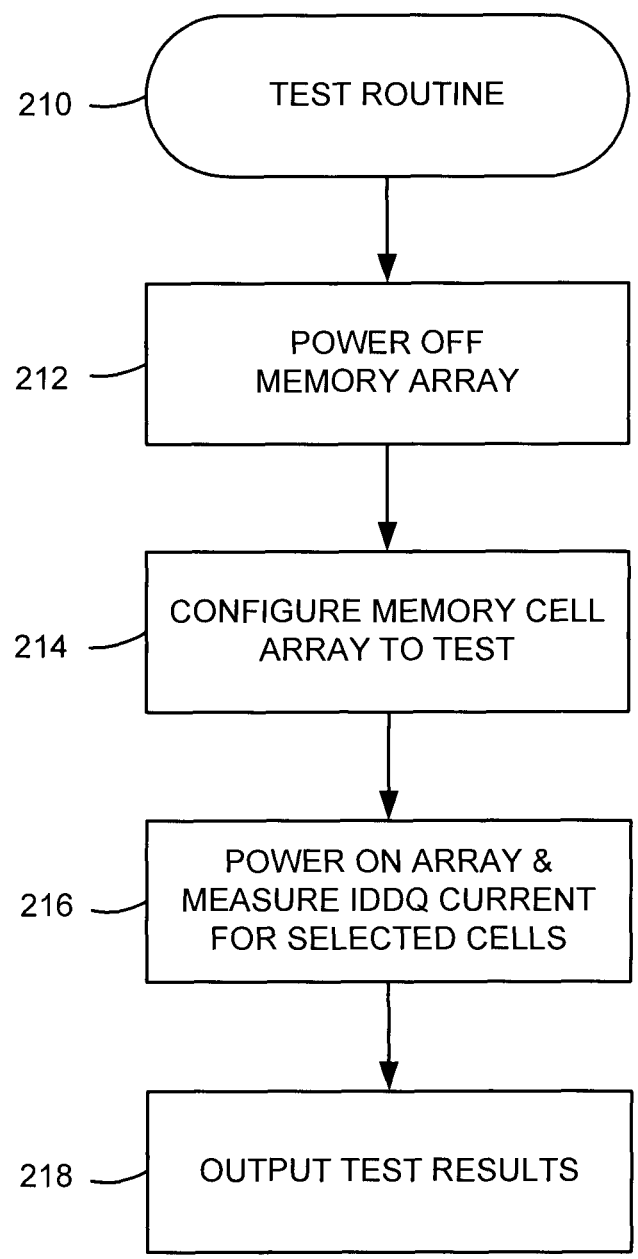
FIG. 13 shows a flow diagram for a test routine performed in accordance with various embodiments of the present invention.

FIG. 13 displays a flow diagram of a test routine 210 performed in accordance with various embodiments of the present invention. At step 212, the memory array 180 is powered off to allow isolation of selected regions for testing. The memory array 180 is configured for testing in step 214 by forming connections, such as those shown in Tables 1, 2, and 3, to accurately identify the type and location of any defects. It should be noted that the configuration of the memory array 180 in step 214 are performed after test signals, such as write currents, manipulate selected resistive sense elements 158 for testing. Once the resistive sense elements 158 are in the predetermined logical state, the row and column decoders 188 and 190 configure the memory array 180 for testing so that BIST can control a quiescent current to identify any defects.

In step 216, the memory array 180 is powered on to allow the BIST to send the quiescent current through the isolated region to identify defects. The quiescent current is evaluated to determine the existence of any fault before outputting a result at step 218. In some embodiments, the BIST can direct the test routine 210 to re-run with a different, or the same, configuration in order to test a different region or better identify the type and location of defects. The repeating of the test routine 210 is especially important when identifying multiple defects that exist in close proximity in the memory array 180.

As can be appreciated by one skilled in the art, the various embodiments illustrated herein provide advantageous writing of data to a memory cell in a fast and reliable manner. The ability to configure a memory cell to cancel stray magnetic fields allows for consistent data writing and reading. In fact, the required write current is reduced due to improved symmetry of directional current passage through the memory cell. Moreover, a highly consistent data rate can be achieved due to improved magnetic stability of the memory cell. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory device comprising:
a memory array having a plurality of unit cells with a resistive sense element and a switching device;
a row decoder connected to the plurality of unit cells;
a column decoder connected to the plurality of unit cells; and
a test circuit which establishes a non-operational configuration of the array via the row and column decoders by powering the array off, isolating the unit cells to be tested, and then powering the array on before a first test pattern with a first sensitivity is sent with a quiescent supply current to identify a first type and location of defects in the memory array and in response to the identified first type of defects a second test pattern with a second sensitivity different from the first sensitivity is chosen and sent with the quiescent supply current to identify a second type and location of defects from the same memory array, the first and second sensitivities respectively computed as a ratio of a difference between a faulty current and a nonfaulty current compared to the nonfaulty current.

2. The memory device of claim 1, wherein the test circuitry comprises a built-in self-test circuitry.

3. The memory device of claim 1, wherein the row and column decoders are activated to identify defects in the array.

4. The memory device of claim 1, wherein the resistive sense element is a non-volatile memory.

5. The memory device of claim 1, wherein the resistive sense element is spin-torque transfer random access memory (STRAM).

6. The memory device of claim 1, wherein a first magnetization is set with a first set current and a second magnetization is set with a second set current.

7. The memory device of claim 1, wherein at least one unit cell undergoes a write operation before being tested.

8. The memory device of claim 1, wherein the row decoder is connected to a plurality of bit lines while the column decoder is connected to a plurality of word lines.

9. A method comprising:
providing a memory array having a plurality of unit cells with a resistive sense element and a switching device, wherein a row decoder and column decoder are connected to the plurality of unit cells; and
testing the array with a test circuit that establishes a non-operational configuration of the array via the row and column decoders by powering the array off, isolating the unit cells to be tested, and then powering the array on before at least two test patterns are successively sent with a quiescent supply current to differentiate between at least first and second types and locations of defects in the same memory array, each test pattern selected in response to a previously identified type of defect result of the immediately preceding test pattern, the at least two test patterns each having different sensitivities computed as a ratio of a difference between a faulty current and a nonfaulty current compared to the nonfaulty current.

10. The method of claim 9, wherein the test circuitry comprises a built-in self-test circuitry.

11. The method of claim 9, wherein the resistive sense element is a non-volatile memory.

12. The method of claim 9, wherein the resistive sense element is spin-torque transfer random access memory (STRAM).

13. The method of claim 9, wherein a first magnetization is set with a first set current and a second magnetization is set with a second set current.

14. The method of claim 9, wherein at least one unit cell undergoes a write operation before being tested.

15. The method of claim 9, wherein the row decoder is connected to a plurality of bit lines while the column decoder is connected to a plurality of word lines.

16. An apparatus comprising:
a memory array having a plurality of unit cells with a resistive sense element and a switching device connected to row and column decoders; and
a test circuit which establishes a non-operational configuration of the array via the row and column decoders, the test circuit configured to identify one or more particular types and locations of defects in the same memory array with more than one test patterns each having different sensitivities, at least one test pattern sensitivity selected in response to a previously identified type of defects, each sensitivity computed as a ratio of a difference between a faulty current and a nonfaulty current compared to the nonfaulty current.

17. The method of claim 9, wherein the test circuit differentiates between the defects with multiple different test patterns, each test pattern following configuring at least one unit cell to a predetermined logical state.

\* \* \* \* \*